United States Patent
Leem et al.

(10) Patent No.: US 7,489,873 B2
(45) Date of Patent: Feb. 10, 2009

(54) OPTICAL SIGNAL RETIMING, RESHAPING, AND REAMPLIFYING (3R) REGENERATION SYSTEM HAVING MONOLITHICALLY INTEGRATED MACH ZEHNDER INTERFEROMETER AND SELF-PULSATING LASER DIODE

(75) Inventors: Young Ahn Leem, Daejeon (KR); Dae Su Yee, Daejeon (KR); Eun Deok Sim, Daejeon (KR); Dong Churl Kim, Daejeon (KR); Kyung Hyun Park, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 472 days.

(21) Appl. No.: 11/284,632

(22) Filed: Nov. 22, 2005

(65) Prior Publication Data
US 2006/0078253 A1 Apr. 13, 2006

(30) Foreign Application Priority Data
Dec. 8, 2004 (KR) .................. 10-2004-0103072
May 20, 2005 (KR) .................. 10-2005-0042421

(51) Int. Cl.
*H04B 10/17* (2006.01)
(52) U.S. Cl. ...................... 398/155; 398/175
(58) Field of Classification Search ............... 398/141, 398/154, 155, 158, 159, 160, 161, 175; 359/337.22, 359/618, 237, 238, 239, 245; 385/2, 3, 9; 356/345; 250/227.12, 227.19, 227.27
See application file for complete search history.

(56) References Cited

U.S. PATENT DOCUMENTS

| | | | |
|---|---|---|---|
| 5,623,359 A * | 4/1997 | Giles et al. .................. | 398/182 |
| 6,122,306 A | 9/2000 | Sartorius et al. | |
| 6,208,454 B1 | 3/2001 | Koren et al. | |
| 6,954,594 B2 * | 10/2005 | Shen et al. .................. | 398/155 |
| 7,266,266 B2 * | 9/2007 | Matsumoto .................. | 385/27 |
| 2001/0028492 A1* | 10/2001 | Janz et al. .................. | 359/173 |
| 2001/0050794 A1* | 12/2001 | Brindel et al. .............. | 359/176 |

OTHER PUBLICATIONS

C. Bornholdt et al., 'Self-pulsating DFB laser for all-optical clock recovery at 40 Gbit/s', IEEE Electronics Letters, Feb. 17, 2000, vol. 36, No. 4.*

* cited by examiner

*Primary Examiner*—Leslie Pascal
(74) *Attorney, Agent, or Firm*—Ladas & Parry LLP

(57) ABSTRACT

The 3R regeneration system for a retiming, reshaping, and reamplifying an optical signal includes: first and second input ports in which a connected optical signal is input; an interferometer including first and second branches formed on a substrate, split at a common input node, combined at a common output node, semiconductor optical amplifiers in each of the first and second branches, the first branch being connected to the first input port, and the common input node being connected to the second input port; a self-pulsating laser diode monolithically integrated with the interferometer between one of the first input port and the first branch, and the second input port and the common input node on the substrate, receiving an optical signal, and outputting the optical signal regenerated by optical injection locking; and an output port connected to the common output node.

20 Claims, 3 Drawing Sheets

OPTICAL SIGNAL RETIMING, RESHAPING, AND REAMPLIFYING (3R) REGENERATION SYSTEM HAVING MONOLITHICALLY INTEGRATED MACH ZEHNDER INTERFEROMETER AND SELF-PULSATING LASER DIODE

BACKGROUND OF THE INVENTION

This application claims the priority of Korean Patent Application Nos. 10-2004-0103072 filed Dec. 8, 2004 and 10-2005-0042421 filed May 20, 2005 in the Korean Intellectual Property Office, the disclosure of which are incorporated herein in their entirety by reference.

1. Field of the Invention

The present invention relates generally to an optical transmission technology for optical communication, and more particularly, to a system for retiming, reshaping, and reamplifying (3R) regeneration of an optical signal.

2. Description of the Related Art

Signal distortions inevitably occur in optical communications. Thus, for example, the signal strength of an optical signal propagating in an optical medium such as an optical cable will be reduced in strength, and its waveform may be temporally deformed or transformed in shape due to dispersion. Such distortion affecting the optical signal in an optical communication system can be removed by performing retiming, reshaping, and reamplifying (3R) regeneration. Because a 3R regeneration system is capable of restoring a distorted optical signal substantially to its original form, it is considered indispensable when forming an optical network.

Of the 3R, the "retiming" or clock regeneration refers to extracting a clock signal from a distorted optical signal and reproducing via a decision circuit an optical signal that is basically in its form before distortion. The clock signal extraction can be performed by a technique utilizing an electrical phase locked loop (PLL) circuit or full optical regeneration technique; however, the clock signal extraction utilizing an electrical PLL circuit will be restricted in the processing speed.

The conventional 3R regeneration technique uses a separate clock regeneration element coupled to a separate decision element. This will inevitably lead to coupling loss due to coupling of the clock regeneration element and the decision element, and, further, the conventional 3R regeneration system utilizing these separate elements will result in a rather complex system as it will require additional elements for adjusting the polarization and delay of the optical signal.

To solve the problems associated with couple loss, some conventional technique proposes a monolithically integrated technology. U.S. Pat. No. 6,208,454 proposes a Mach-Zehnder wavelength converter integrated with an integrated distributed feedback (DFB) function or a tunable laser diode. This conventional monolithically integrated technology is reportedly considered useful for high-speed operations owing to somewhat low coupling loss; however, it is not shown to produce results for wavelength conversions of more than 10 Gbps due to problems of surface reflection and others. Thus, no conventional technique has produced acceptable results in producing a functioning monolithically integrated 3R regeneration system.

SUMMARY OF THE INVENTION

The present invention provides a 3R regeneration system that can be easily embedded on a single substrate.

According to an aspect of the present invention, there is provided a 3R regeneration system comprising: first and second input ports to which a split optical signal is input; an interferometer comprising: first and second branches formed on a substrate, split at a common input node, and incorporated at a common output node; semiconductor optical amplifiers in each of the first and second branches, the first branch being connected to the first input port, and the common input node being connected to the second input port; a self-pulsating laser diode monolithically integrated with the interferometer between the first input port and the first branch, or between the second input port and the common input node on the substrate, and receiving an optical signal, and outputting the optical signal regenerated by optical injection locking; and an output port connected to the common output node.

The interferometer may be a Mach-Zehnder interferometer.

The first input port and the first branch are interconnected via an input waveguide, and the second input port and the common input node are interconnected via an input waveguide, and the common output node and the output port are interconnected via an output waveguide.

According to another aspect of the present invention, there is provided a 3R regeneration system wherein the port is a third input port, and the self-pulsating laser diode is interposed between the first input port and the first branch, further comprising: a second self-pulsating laser diode monolithically integrated with the interferometer between the third input port and the second branch, receiving an optical signal, and outputting the optical signal regenerated by the optical injection locking; and a delay element interposed between one of the first input port and the self-pulsating laser diode, or the third input port and the second self-pulsating laser diode on the substrate.

According to still another aspect of the present invention, there is provided a 3R regeneration system comprising: an input port in which an optical signal is input; an interferometer including first and second branches formed on a substrate, split at a common input node, combined at a common output node, semiconductor optical amplifiers in each of the first and second branches, and the common input node being connected to the input port; a first output port connected to the first branch, and a second output port connected to the common output node; and a self-pulsating laser diode monolithically integrated with the interferometer between one of the first output port and the first branch, or the second output port and the common input node on the substrate, receiving an optical signal, and outputting the optical signal regenerated by optical injection locking.

According to yet another aspect of the present invention, there is provided a 3R regeneration system wherein the port is a third output port, and the self-pulsating laser diode is interposed between the first output port and the first branch, further comprising: a second self-pulsating laser diode monolithically integrated with the interferometer between the third output port and the second branch, receiving an optical signal, and outputting the optical signal regenerated by the optical injection locking; and a delay element formed in one of the first branch and the second branch.

BRIEF DESCRIPTION OF THE DRAWINGS

The above and other features and advantages of the present invention will become more apparent by describing in detail preferred embodiments thereof with reference to the attached drawings in which.

DETAILED DESCRIPTION OF THE INVENTION

Figure 1:
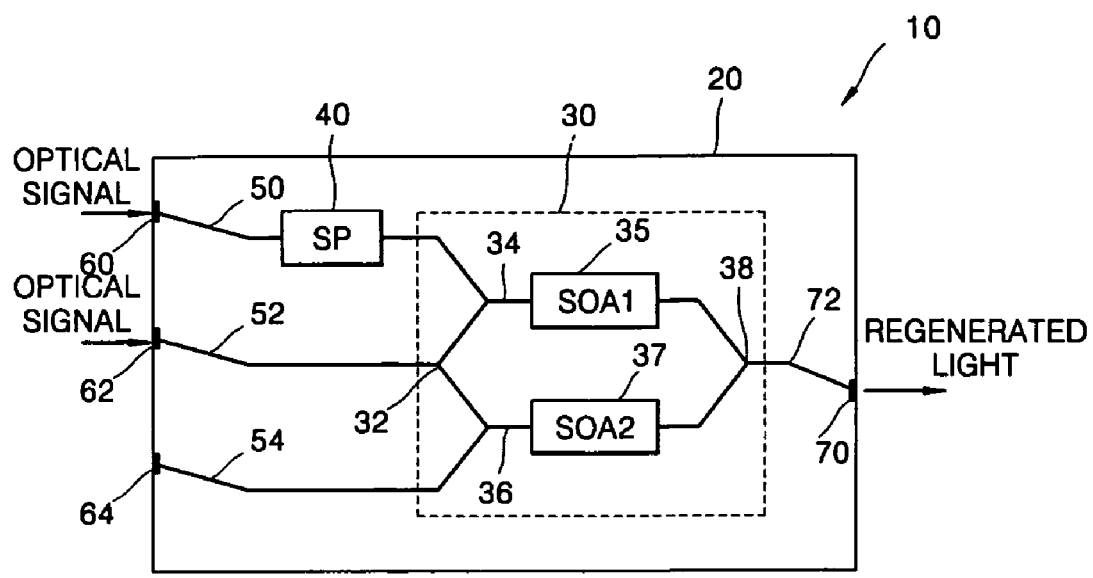
FIG. 1 is a schematic diagram of a 3R regeneration system according to an embodiment of the present invention.

The present invention will now be described more fully with reference to the accompanying drawings, in which exemplary embodiments of the invention are illustrated. The invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, the thickness of layers and regions are exaggerated for clarity. Like reference numerals in the drawings denote like elements.

FIG. 1 is a schematic diagram of a monolithically integrated 3R regeneration system 10 according to an embodiment of the present invention. Referring to FIG. 1, the 3R regeneration system 10 includes a Mach-Zehnder interferometer 30 and a self-pulsating laser diode SP 40 integrated on a substrate 20. A split optical signal is inputted to a first input port 60 and a second input port 62, and a regenerated optical signal is outputted from an output port 70.

The Mach-Zehnder interferometer 30 includes a first branch 34 and a second branch 36, which are connected at a common input node 32 and connected at a common output node 38. The first branch 34 includes a first semiconductor optical amplifier (SOA1) 35, and the second branch 36 includes a second semiconductor optical amplifier (SOA2) 37. In general, a Mach-Zehnder interferometer transmits two equally divided beams of incident light in two separate paths that are then combined later.

The first input port 60 and the first branch 34 are interconnected via a first input waveguide 50, and the second input port 62 and the common input node 32 are interconnected via a second input waveguide 52. The 3R regeneration system 10 may further include an additional input port 64 connected to the second branch 36 via a third input waveguide 54. The additional input port 64 is formed symmetrical to the first input port 60 with the second port 62 in between, and the additional input port 64 can be left in or out of the 3R regeneration system 10. The common output node 38 and the output port 70 are interconnected via an output waveguide 72.

The self-pulsating laser diode (SP) 40 is monolithically integrated with the Mach-Zehnder interferometer 30 and is connected between the first input port 60 and the first branch 34. The self-pulsating laser diode (SP) 40 receives an optical signal and outputs an optical clock signal regenerated by an optical injection locking. The first input port 60 is a "pump" (i.e., one that makes a decision), and the second input port 62 is a "probe" (i.e., one that is affected by the decision).

The operation of the 3R regeneration system 10 will now be described. A distorted optical signal is split and inputted to the first input port 60 and the second input port 62 as illustrated in FIG. 1. From the inputted distorted optical signal, the self-pulsating laser diode (SP) 40 extracts the optical clock signal regenerated by the optical injection locking and sends the regenerated optical clock signal to the first semiconductor optical amplifier (SOA1) 35. As such, one of the 3R regeneration functions—retiming or clock signal generation—is performed.

The signal inputted to the second input port 62 is split at the common input node 32 to pass through the first semiconductor optical amplifier (SOA1) 35 and the second semiconductor optical amplifier (SOA2) 37. The signals outputted from SOA1 35 and SOA2 37 are combined at the common output node 38, and then outputted to the output port 70. The optical signal passing through the first semiconductor optical amplifier (SOA1) 35 periodically undergoes phase shift due to a charge density caused by the regenerated clock signal, so that the remaining 2R (reshaping and reamplifying) regeneration functions are performed due to interference with the optical signal passing through the second semiconductor optical amplifier (SOA2) 37.

A monolithically integrated 3R regeneration system such as 10 in FIG. 1 is formed by monolithically integrating the self-pulsating laser diode (SP) 40 and the Mach-Zehnder interferometer 30. Due to monolithic integration of the 3R regeneration system 10, the coupling loss is less than the loss occurring in a conventional 3R regeneration system with elements coupled separately. The monolithically integared 3R regeneration system 10 is also more compact than the conventional system. The monolithically integrated 3R regeneration system 10 also relaxes polarized transparency. Furthermore, an optical clock signal and a 3R regenerated signal is obtained by inputting an input signal to the monolithically integrated 3R regeneration system; therefore, a device for spontaneously performing the 3R regeneration function is realized.

Figure 2:
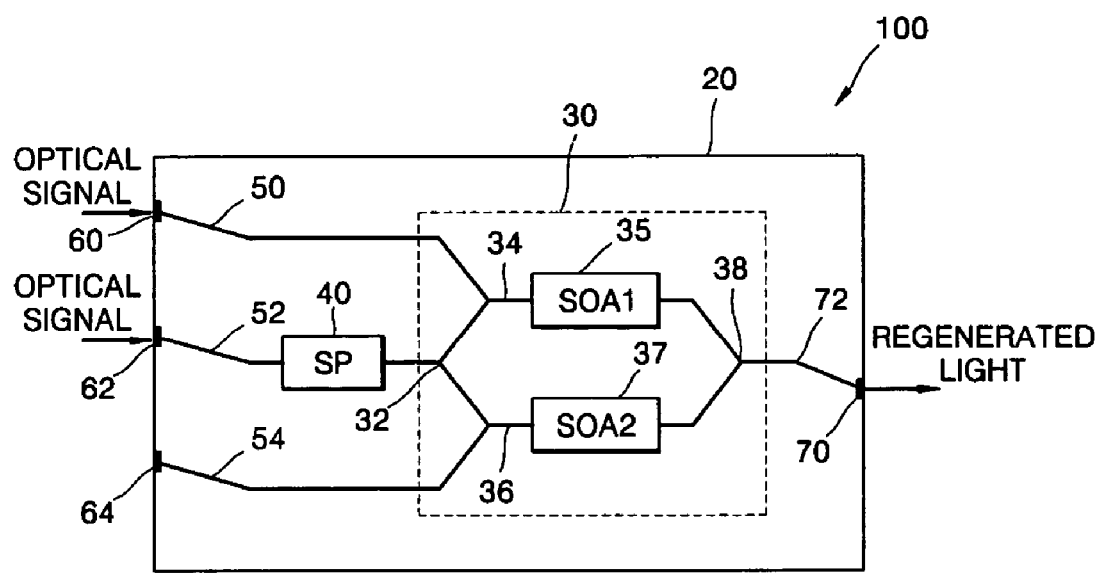
FIG. 2 is a schematic diagram of a 3R regeneration system according to another embodiment of the present invention.

FIG. 2 is a schematic diagram of a 3R regeneration system 100 according to another embodiment of the present invention. The 3R regeneration system 100 in this embodiment is same as the 3R regeneration system 10 illustrated in FIG. 1 except that the input ports for pump and probe are switched. Referring to FIG. 2, a self-pulsating laser diode SP 40 is interposed between a second input port 62 and a common input node 32, so that a first input port 60 is a probe, and the second input port 62 is a pump. The operation of the 3R regeneration system 100 can be easily understood from the description above with reference to FIG. 1.

In the 3R regeneration system 100, an optical clock signal outputted from the self-pulsating laser diode (SP) 40 is split at a common input node 32 and inputted to a first semiconductor optical amplifier (SOA1) 35 and a second semiconductor optical amplifier (SOA2) 37. A distorted optical signal inputted to the probe, i.e., the first input port 60, is transmitted to the first semiconductor optical amplifier (SOA1) 35. The operation of the Mach-Zehnder interferometer 30 is as same as that of FIG. 1.

Figure 3:
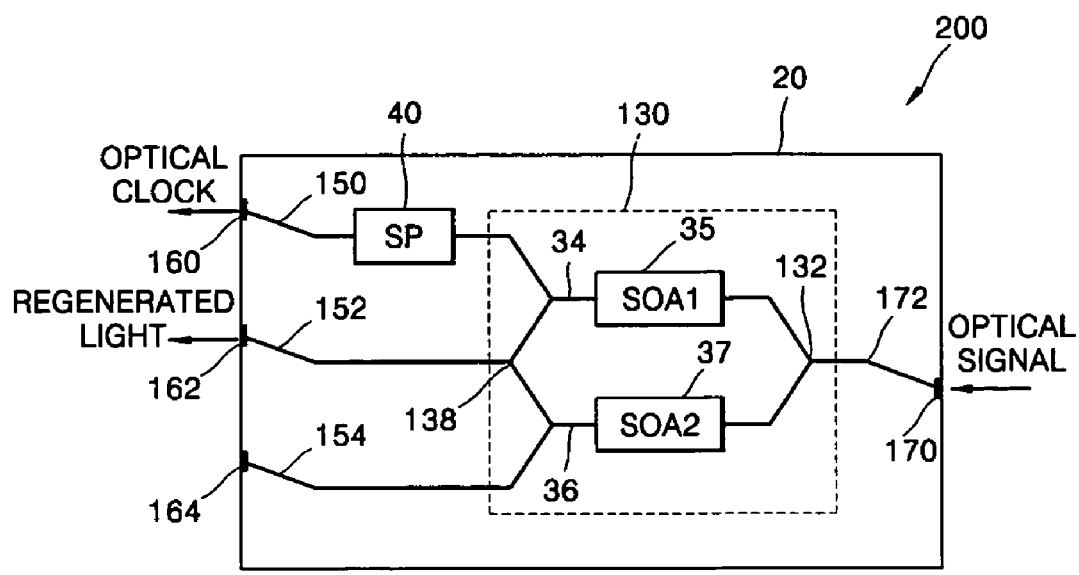
FIG. 3 is a schematic diagram of a 3R regeneration system according to still another embodiment of the present invention.

In the two embodiments described with respect to FIGS. 1-2, the 3R regeneration systems 10 and 100 cannot remove a falling edge of the distorted optical signal since the regenerated optical clock signal through the self-pulsating laser diode SP 40 is outputted along with the split distorted optical signal. To solve this problem, a 3R regeneration system 200 is provided in FIG. 3. FIG. 3 is a schematic diagram of the 3R regeneration system 200 according to yet another embodiment of the present invention. The 3R regeneration system 200 is the same as the 3R regeneration system 10 illustrated in FIG. 1 except that the input and output ports are exchanged. The first input port 60 (FIG. 1), the second input port 62 (FIG. 1), the common input node 32 (FIG. 1), the common output node 38 (FIG. 1), and the output port 70 (FIG. 1) of the 3R regeneration system 10 (FIG. 1) are respectively identical to a first output port 160 (FIG. 3), a second output port 162 (FIG. 3), a common output port 138 (FIG. 3), a common input port 132 (FIG. 3), and an input port 170 (FIG. 3) of the 3R regeneration system 200 (FIG. 3).

The first output port 160 is connected to a first branch 34 of a Mach-Zehnder interferometer 130 via a first output waveguide 150; the second output port 162 is connected to a common output node 138 via a second output waveguide 152; and the input port 170 is connected to the common input node 132 via an input waveguide 172. The 3R regeneration system 200 may further include another ouput port 164 connected to a second branch 36 via a third output waveguide 154. The additional output port 164 is formed symmetrical to the first output port 160, and thus the output port 164 can be left in or out of the 3R regerantion system 200.

The operation of the monolithically integrated 3R regeneration system 200 will now be described. An optical signal inputted to the input port 170 is split at the common input node 132 and passed through a first semiconductor optical amplifier (SOA1) 35 and a second semiconductor optical amplifier (SOA2) 37. The optical signal passed through and outputted by the first semiconductor optical amplifier (SOA1) 35 is split at the node connecting the first branch 34 and the first output waveguide 150. At this node, a first section of the split optical signal passes through a center output port, i.e., the second output port 162, and a second section of the split optical signal passes through a self-pulsating laser diode (SP) 40. A clock signal regenerated by the injection locking in the self-pulsating laser diode SP 40 is outputted at the output port 160. Since the SP 40 discharges the clock signal in both directions, the discharged clock signal passes through the first semiconductor optical amplifier (SOA1) 35 and then is outputted to the output port 162, which signal is then 3R regenerated.

As such, the present invention according to this embodiment is capable of spontaneously performing the 3R regeneration using a single input signal. The 3R regeneration system 200 has less amount of distorted signals included in the optical clock signal than those of the 3R regeneration system 10 and 100 illustrated in FIGS. 1 and 2, respectively. The operating principle is identical to the counter propagating scheme found in a Mach-Zehnder interferometer. Therefore, two optical signals (one being the regenerated optical clock signal from the SP 40 and the other being the distorted optical signal) are superimposed or overlapped at the first semiconductor optical amplifier (SOA1) 35 based on the distance between the SOA1 35 and the SP 40. In a case of 40 Gbps transmission speed, the separation between two signals from the SOA1 35 and the SP 40 is 25 ps, which means that the propagating distance in a waveguide is 2.5 mm. This allows design of two light signals maximally overlapped in the SOA1 35.

Figure 4:
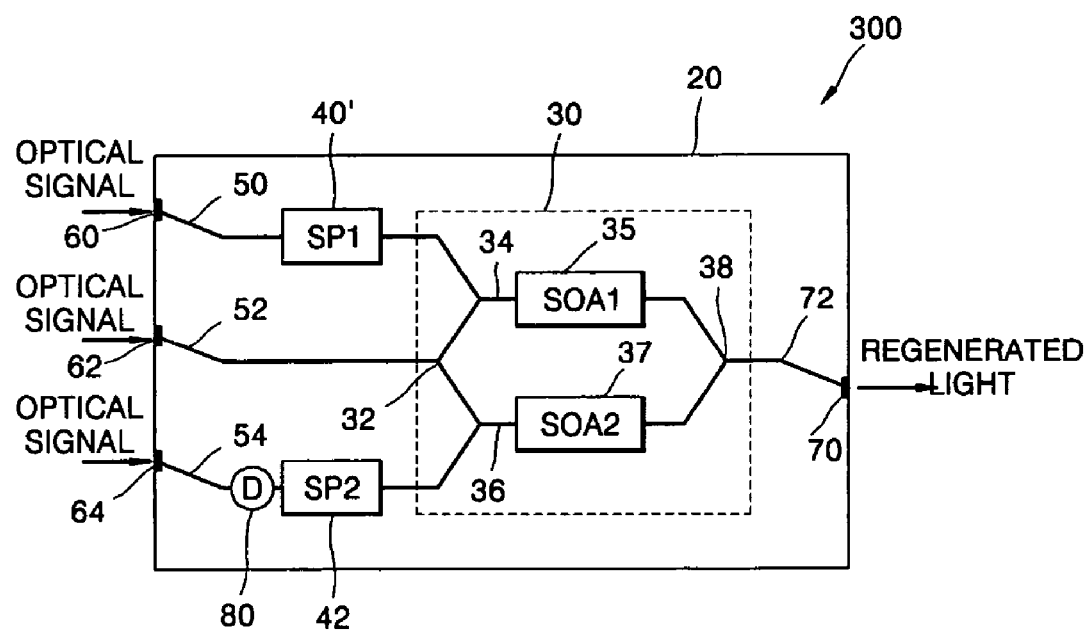
FIG. 4 is a schematic diagram of a 3R regeneration system according to yet another embodiment of the present invention.
Figure 5:
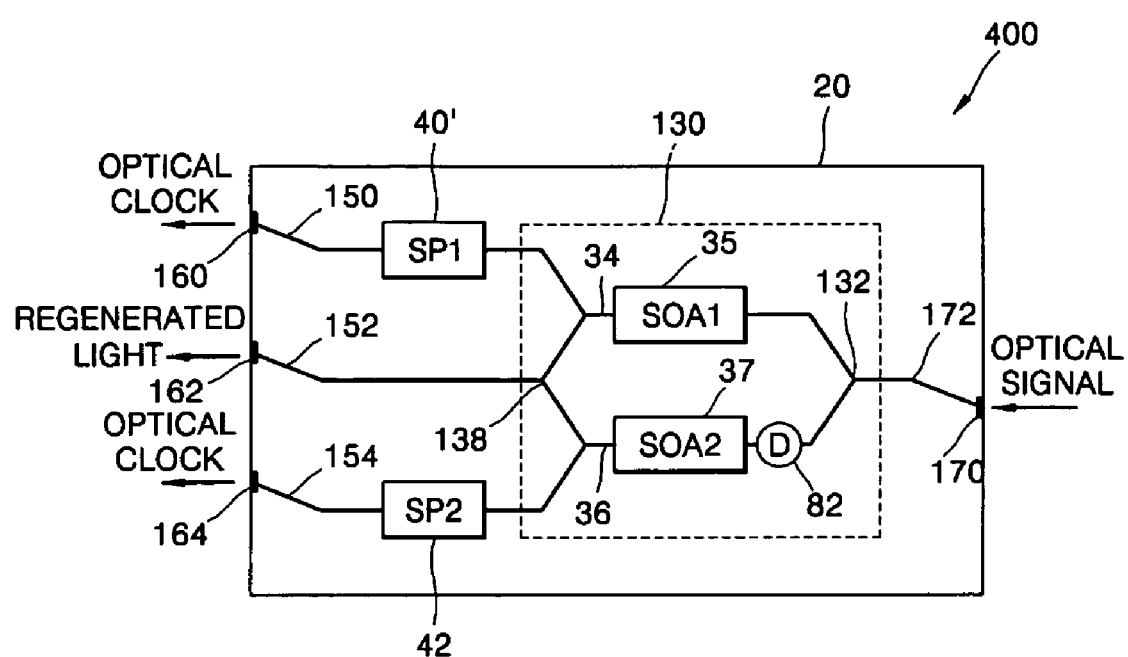
FIG. 5 is a schematic diagram of a 3R regeneration system according to a further embodiment of the present invention.

FIG. 4 shows a differential scheme of the 3R regeneration system 10 illustrated in FIG. 1 according to yet another embodiment of the present invention, and FIG. 5 shows a differential scheme of the 3R regeneration system 200 illustrated in FIG. 3 according to a further embodiment of the present invention.

Referring to FIG. 4, a 3R regeneration system 300 is almost identical to the 3R regeneration system 10 illustrated in FIG. 1, except that a third input port 64 connected to the second branch 36 is now in use. In addition to a first self-pulsating laser diode (SP1) 40' interposed between a first input port 60 and a first branch 34, the 3R regeneration system 300 has a second self-pulsating laser diode (SP2) 42 that is also monolithically integrated with a mach-zehnder interferometer 30 between the third input port 64 and a second branch 36. The 3R regeneration system 300 further includes a delay element 80 interposed between the third input port 64 and the second self-pulsating laser diode (SP2) 42. The delay element 80 may be interposed between the first input port 60 and the self-pulsating laser diode SP1 40' instead.

The operation of the monolithically integrated 3R regeneration system 300 will now be described. When a distorted optical signal is split and inputted to the first input port 60, the second input port 62, and the third input port 64, the distorted optical signal will pass through the first self-pulsating laser diode (SP1) 40', which will in turn ouput an optical clock signal regenerated by optical injection locking to a first semiconductor optical amplifier (SOA1) 35. The optical signal passing through the delay element 80 is phase shifted and passes through the second self-pulsating laser diode (SP2) 42. The signal outputted by the SP2 42 is transmitted to the second semiconductor optical amplifier (SOA2) 37. The optical signal inputted to the second input port 62 is split at a common input node 32 to pass through the SOA1 35 and the SOA2 37. The signals outputted by the SOA1 35 and SOA2 37 are combined at a common output node 38, and the combined signal is outputted at an output port 70. The phase difference between the signals passing through the SOA1 35 and the SOA2 37 results in removal of a falling edge signal (that is, the removal of the tail of the falling time), which in turn produces an optical signal profile within a predetermined range.

Referring to FIG. 5, a 3R regeneration system 400 is almost identical to the 3R regeneration system 200 illustrated in FIG. 3 except that a third ouput port 164 connected to the second branch 36 is now in use. The 3R regeneration system 400 includes (1) a first self-pulsating laser diode (SP1) 40' interposed between a first output port 160 and a first branch 34, and (2) a second self-pulsating laser diode (SP2) 42 that is also monolithically integrated with a mach-zehnder interferometer 130 between the third output port 164 and a second branch 36. The 3R regeneration system 400 further includes a delay element (D) 82 in the second branch 36. The delay element 82 may be formed in the first branch 34 instead.

The operation of the monolithically integrated 3R regeneration system 400 will now be described. An optical signal inputted to an input port 170 is split at a common input node 132 and passes through a first semiconductor optical amplifier (SOA1) 35 and a second semiconductor optical amplifier (SOA2) 37. The optical signal passing through and outputted by the first semiconductor optical amplifier (SOA1) 35 is split at a node connecting a first output waveguide 150 and the first branch 34. A split portion of the optical signal is outputted at a second output port 162, and a another split portion of the optical signal is transmitted to the first self-pulsating laser diode (SP1) 40'. The SP1 40' discharges in both directions a clock signal regenerated by optical injection locking. Since the regenerated clock signal is discharged in both directions (to the first output port 160 and to the first semiconductor optical amplifier (SOA1) 35), the regenerated optical clock signal passes through the first semiconductor optical amplifier (SOA1) 35. The optical signal passing through the second semiconductor optical amplifier (SOA2) 37 has a phase difference generated by the delay element 82, and the signal outputted by SOA2 37 is split at a node connecting a third output waveguide 154 and the second branch 36. A split portion of the optical signal is outputted to the second output port 162, and another split portion of the optical signal passes through the second self-pulsating laser diode (SP2) 42. The SP2 42 discharges in both directions a clock signal regenerated by optical injection locking. Since the regenerated clock signal is discharged in both directions (to the third output port 164 and to the second semiconductor optical amplifier (SOA2) 37), the regenerated optical clock signal passes through the SOA2 37. The phase difference between the signals passing through the SOA1 35 and the SOA2 37 results in removal of a falling edge signal (that is, removal of the tail of the falling time), thereby obtaining an optical signal profile within a predetermined range.

As described above, a monolithically integrated 3R regeneration system according to various embodiments of the present invention is provided by integrating a self-pulsating laser diode with an interferometer such as a mach-zehnder interferometer, so that it can be easily embedded in a single substrate. The monolithically integrated 3R regeneration system of the present invention has less coupling loss than a conventional element coupling system and performs 3R regeneration capably. The monolithically integrated 3R regeneration system of the present invention also relaxes polarized transparency. The monolithically integrated 3R regeneration system of the present invention can obtain an optical clock signal and a 3R regenerated signal by inputting a single input signal, thereby realizing a device for spontaneously performing the 3R functions. In particular, 3R regeneration is spontaneously performed using a signal only.

While this invention has been particularly illustrated and described with reference to preferred embodiments thereof, it will be understood by those skilled in the art that various changes in form and details may be made therein without departing from the spirit and scope of the invention as defined by the appended claims.

What is claimed is:

1. A monolithically integrated 3R regeneration system comprising:
    a first input port receiving a first split optical signal;
    a second input port receiving a second split optical signal, wherein the second input port is connected to a common input node;
    a first self-pulsating laser diode (SP1) receiving either one of the first and second split optical signals and outputting a first regenerated clock signal;
    an interferometer monolithically integrated with the SP1, the interferometer receiving the first regenerated clock signal and either one of the first and second split optical signals and generating and producing a reshaped and reamplified output optical signal as a 3R regenerated optical signal, wherein the interferometer includes a first branch and a second branch each of which is connected to the common input node, such that the first regenerated clock or the second split optical signal is received by the common node and split to each of the first and second branch; and
    an output port outputting the 3R regenerated optical signal.

2. The 3R regeneration system of claim 1,
    wherein the first spilt optical signal is received by the SP1, and
    wherein the interferometer comprises:
        a first semiconductor optical amplifier (SOA1) receiving the first regenerated clock signal and the second split optical signal being superimposed on the first regenerated clock signal, shaping and amplifying the superimposed signal, and then outputting it as a first output signal; and
        a second semiconductor optical amplifier (SOA2) receiving the second split optical signal, shaping and amplifying the second split signal, and outputting it as a second output signal; and
    wherein the first and second output signals are combined to produce the 3R regenerated optical signal outputted at the output port.

3. The 3R regeneration system of claim 2, wherein the interferometer is a Mach-Zehnder interferometer.

4. The 3R regeneration system of claim 3 further comprising:
    a first waveguide formed between the first input port and SP1;
    a second waveguide formed between the SP1 and a first node;
    a third waveguide formed between the first node and SOA1;
    a fourth waveguide formed between the first node and the common input node, wherein the second, third, and fourth waveguides are joined at the first node for optical signal propagation;
    a fifth waveguide formed between the second input port and the common input node;
    a sixth waveguide formed between the common input node and the second node, wherein the fourth, fifth, and sixth waveguides are joined at the common input node for optical signal propagation;
    a seventh waveguide formed between the second node and the SOA2, wherein the sixth and seventh waveguides are joined at the second node for optical signal propagation;
    an eighth waveguide is formed between SOA1 and a common output node;
    a ninth waveguide is formed between SOA2 and the common output node;
    a tenth waveguide is formed between the common output node and the output port, wherein the eighth, ninth, and tenth waveguides are joined at the common output node for optical signal propagation; and
    wherein all waveguides are monolithically integrated with the SP1 and the interferometer.

5. The 3R regeneration system of claim 4 further comprising:
    a third input port connected to the second node via an eleventh waveguide, wherein the sixth, seventh, and eleventh waveguides are joined at the second node for optical signal propagation.

6. The 3R regeneration system of claim 1,
    wherein the second split optical signal is received by the SP1, and
    wherein the interferometer comprises:
        a first semiconductor optical amplifier (SOA1) receiving the first split optical signal, shaping and amplifying the first split optical signal, and then outputting it as a first output signal; and
        a second semiconductor optical amplifier (SOA2) receiving the second split optical signal and the first regenerated clock signal superimposed on the second split optical signal, shaping and amplifying the superimposed optical signal, and then outputting it as a second output signal; and
    wherein the first and second output signals are combined to produce the 3R regenerated optical signal outputted at the output port.

7. The 3R regeneration system of claim 6, wherein the interferometer is a Mach-Zehnder interferometer.

8. The 3R regeneration system of claim 7 further comprising:
    a first waveguide formed between the first input port and the first node;
    a second waveguide formed between the second input port and SP1;

a third waveguide formed between the first node and SOA1;

a fourth waveguide formed between the first node and the common input node, wherein the first, third, and fourth waveguides are joined at the first node for optical signal propagation;

a fifth waveguide formed between SP1 and the common input node;

a sixth waveguide formed between the common input node and the second node, wherein the fourth, fifth, and sixth waveguides are joined at the common input node for optical signal propagation;

a seventh waveguide formed between the second node and the SOA2, wherein the sixth and seventh waveguides are joined at the second node for optical signal propagation;

an eighth waveguide is formed between SOA1 and a common output node;

a ninth waveguide is formed between SOA2 and the common output node;

a tenth waveguide is formed between the common output node and the output port, wherein the eighth, ninth, and tenth waveguides are joined at the common output node for optical signal propagation; and wherein all waveguides are monolithically integrated with the SP1 and the interferometer.

9. The 3R regeneration system of claim 8 further comprising:

a third input port connected to the second node via an eleventh waveguide, wherein the sixth, seventh, and eleventh waveguides are joined at the second node for optical signal propagation.

10. The 3R regeneration system of claim 1, wherein the first split optical signal is received by SP1, the 3R regeneration system further comprising:

a third input port receiving a third split optical signal;

a delay element receiving the third split optical signal and outputting a delayed third optical signal;

a second self-pulsating laser diode (SP2) monolithically integrated with the interferometer, the SP2 receiving the delayed third optical signal and producing a second regenerated clock signal;

wherein the interferometer comprises:

a first semiconductor optical amplifier (SOA1) receiving the first regenerated clock signal and a second split signal superimposed on the first regenerated clock signal, shaping and amplifying the superimposed signal, and then outputting it as a first output signal;

a second semiconductor optical amplifier (SOA2) for receiving the second split signal and the second regenerated clock signal superimposed on the second split signal, shaping and amplifying the superimposed signal, and then outputting it as a second output signal;

wherein the first and second output signals are combined to produce the 3R regenerated optical signal outputted at the output port.

11. The 3R regeneration system of claim 10, wherein the interferometer is a Mach-Zehnder interferometer.

12. The 3R regeneration system of claim 11, further comprising:

a first waveguide formed between the first input port and SP1;

a second waveguide formed between the SP1 and a first node;

a third waveguide formed between the first node and SOA1;

a fourth waveguide formed between the first node and the common input node, wherein the second, third, and fourth waveguides are joined at the first node for optical signal propagation;

a fifth waveguide formed between the second input port and the common input node;

a sixth waveguide formed between the common input node and the second node, wherein the fourth, fifth, and sixth waveguides are joined at the common input node for optical signal propagation;

a seventh waveguide formed between the second node and the SOA2, wherein the sixth and seventh waveguides are joined at the second node for optical signal propagation;

an eighth waveguide formed between the third input port and the delay element;

a ninth waveguide formed between the delay element and the SP2;

a tenth waveguide formed between the SP2 and the second node, wherein the sixth, seventh, and tenth waveguides are joined at the tenth node for optical signal propagation;

an eleventh waveguide formed between SOA1 and a common output node;

a twelfth waveguide formed between SOA2 and the common output node;

a thirteenth waveguide formed between the common output node and the output port, wherein the eleventh, twelfth, and thirteenth waveguides are joined at the common output node for optical signal propagation, and wherein all waveguides are monolithically integrated with the SP1, the SP2, and the interferometer.

13. A monolithically integrated 3R regeneration system comprising:

a input port receiving an input optical signal;

an interferometer comprising:

a first semiconductor optical amplifier (SOA1) receiving a split portion of the input optical signal, shaping and amplifying the received signal, and outputting it as a first output signal;

a second semiconductor optical amplifier (SOA2) receiving another split portion of the input optical signal, shaping and amplifying the received signal, and outputting it as a second output signal:

a self-pulsating laser diode (SP) monolithically integrated with the interferometer, receiving the first output signal, and outputting a regenerated clock signal produced by optical injection locking back to the SOA1;

a second output port outputting a 3R regenerated signal received from SOA1, wherein the 3R regenerated signal is produced by combing the regenerated clock signal and the first output signal.

14. The 3R regeneration system of claim 13, wherein the interferometer is a Mach-Zehnder interferometer.

15. The 3R regeneration system of claim 14 further comprising:

a first waveguide formed between the input port and a common input node;

a second waveguide formed between the SOA1 and the common input node;

a third waveguide formed between the common input node and the SOA2, wherein the first, second, and third waveguides are joined at the common input node for optical signal propagation;

a fourth waveguide formed between the SOA1 and a first node;

a fifth waveguide formed between the first node and the SP;

a sixth waveguide formed between the first node and a common output node, wherein the fourth, fifth, and sixth waveguides are joined at the first node for optical signal propagation;
a seventh waveguide formed between the common output node and the second output port;
an eighth waveguide formed between the common output node and the second node;
a ninth waveguide formed between the second node and the SOA2, wherein the eighth and ninth waveguides are joined at the second node for optical signal propagation, and wherein all waveguides are monolithically integrated with the SP and the interferometer.

16. The 3R regeneration system of claim 15 further comprising: a first outputput port connected to the SP via a tenth waveguide; and
a third output port connected to the second node via an eleventh waveguide, wherein the eighth, ninth, and eleventh waveguides are joined at the second node for optical signal propagation.

17. A monolithically integrated 3R regeneration system comprising:
an input port receiving an input optical signal;
an interferometer comprising:
a first semiconductor optical amplifier (SOA1) receiving a split portion of the input optical signal, amplifying the received signal, and outputting it as a first output signal;
a delay element receiving another split portion of the input optical signal and introducing a predetermined phase delay in the received input signal;
a second semiconductor optical amplifier (SOA2) the phase delayed signal from the delay element, amplifying the phase-delayed signal, and outputting it as a second output signal:
a first self-pulsating laser diode (SP1) monolithically integrated with the interferometer and receiving the first output signal and outputting a first regenerated clock signal produced by optical injection locking back to the SOA1;
a second self-pulsating laser diode (SP2) monolithically integrated with the interferometer and receiving the first output signal and outputting a regenerated clock signal produced by optical injection locking back to the SOA2;
a second output port receiving signals from the SOA1 and from the SOA2 and outputting a 3R regenerated signal, wherein the 3R regenerated signal is produced by combining:
(1) the signal from SOA1 that is a combination of the first regenerated clock signal and the first output signal; and
(2) the signal from SOA2 that is a combination of the second regenerated clock signal and the second output signal.

18. The 3R regeneration system of claim 17, wherein the interferometer is a Mach-Zehnder interferometer.

19. The 3R regeneration system of claim 18 further comprising:
a first waveguide connected between the input port and a common input node;
a second waveguide connected between the common input node and the SOA1;
a third waveguide connected between the common input node and the delay element, wherein the first, second, and third waveguides are joined at the common input node for optical signal propagation;
a fourth waveguide connected between the delay element and the SOA2;
a fifth waveguide connected between the SOA1 and a first node;
a sixth waveguide connected between the first node and the SP1;
a seventh waveguide connected between the first node and a common output node, wherein the fifth, sixth, and seventh waveguides are joined at the first node for optical signal propagation;
an eighth waveguide connected between the common input node and the second output port;
a ninth waveguide connected between the common input node and the second node;
a tenth waveguide connected between the second node and the SOA2;
an eleventh waveguide connected between the second node and the SP2, wherein the ninth, tenth, and eleventh waveguides are joined at the second node for optical signal propagation and wherein all waveguides are monolithically integrated with the SP1, the SP2, and the interferometer.

20. The 3R regeneration system of claim 19 further comprising:
a first outputput port connected to the SP1 via a twelfth waveguide; and a third output port connected to the SP2 via a thirteenth waveguide.

* * * * *